United States Patent [19]

Kaneko et al.

[11] 4,378,721
[45] Apr. 5, 1983

[54] PICKUP APPARATUS FOR AN ELECTRIC STRING TYPE INSTRUMENT

[75] Inventors: Kenkichi Kaneko; Katsuyuki Tanaka, both of Hamamatsu; Satoru Hayashi, Toyoda; Kensaku Hakamada, Hamamatsu; Masakazu Matsumoto, Hamamatsu; Shinji Tagaki, Hamamatsu; Takayuki Goshima, Toyoda, all of Japan

[73] Assignee: Kabushiki Kaisha Kawai Seisakusho, Hamamatsu, Japan

[21] Appl. No.: 367,356

[22] Filed: Apr. 12, 1982

Related U.S. Application Data

[63] Continuation of Ser. No. 56,436, Jul. 10, 1979, abandoned.

[30] Foreign Application Priority Data

| Jul. 20, 1978 | [JP] | Japan | 53-87693 |
| Dec. 8, 1978 | [JP] | Japan | 53-168034 |
| Dec. 20, 1978 | [JP] | Japan | 53-173704 |
| Dec. 29, 1978 | [JP] | Japan | 53-180128 |
| Dec. 29, 1978 | [JP] | Japan | 53-180129 |
| Feb. 2, 1979 | [JP] | Japan | 54-11534 |

[51] Int. Cl.³ .............................. G10H 3/18
[52] U.S. Cl. ............................ 84/1.14; 84/1.16; 84/DIG. 24; 252/62.9; 310/357; 310/358; 310/800
[58] Field of Search ................ 84/1.14–1.16, 84/DIG. 24; 252/62.9; 310/340, 345, 348, 357, 358, 365, 368, 369, 800

[56] References Cited

U.S. PATENT DOCUMENTS

| 2,231,159 | 2/1941 | Gerlach | 310/357 X |
| 3,018,680 | 1/1962 | Paul | 84/1.16 |
| 3,049,958 | 8/1962 | Benioff | 84/1.16 |
| 3,070,775 | 12/1962 | Andrews, Jr. | 310/357 X |
| 3,519,721 | 7/1970 | Martin et al. | 84/1.14 |
| 3,712,951 | 1/1973 | Rickard | 84/1.14 |
| 3,781,955 | 1/1974 | Lavrinenko et al. | 310/358 X |
| 3,801,839 | 4/1974 | Yo | 310/357 |
| 3,820,208 | 6/1974 | Baldy | 310/69 X |
| 4,204,135 | 5/1980 | Murayama | 310/800 X |
| 4,211,139 | 7/1980 | Murakami | 84/1.14 |
| 4,227,111 | 10/1980 | Cross et al. | 310/358 |

*Primary Examiner*—Stanley J. Witkowski
*Attorney, Agent, or Firm*—Armstrong, Nikaido, Marmelstein & Kubovcik

[57] ABSTRACT

A pickup for an electric string type instrument comprising an elongated piezo-electric member formed by mixing a high molecular material with piezo-electric ceramic powder and a vulcanizing or cross-linking agent and then vulcanizing or cross-linking the mixture. In order to complete the pickup a pair of electrodes are mounted on the elongated member and the member is then subjected to a polarization treatment. The piezo-electric member can be formed as a flat belt-shaped member with the electrodes mounted on both surfaces thereof or it can be formed as a cylinder in which one of the electrodes extends axially in the piezo-electric member and the other electrode is mounted on the outer periphery of the piezo-electric member. A plurality of the pickups can be joined in parallel relation within an elastic support and the latter can be mounted between the strings and the frame of the string instrument through the intermediary of a bridge member.

10 Claims, 28 Drawing Figures

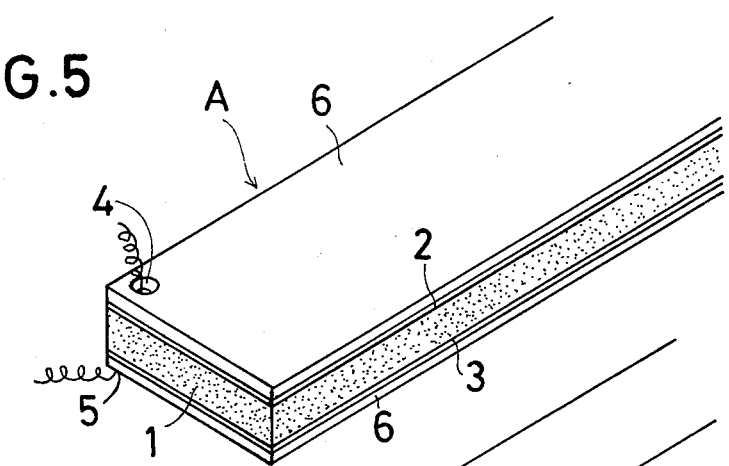
FIG.5
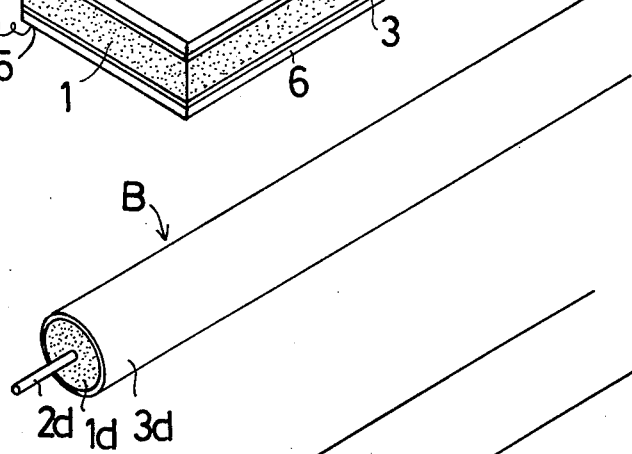
FIG.6
FIG.7
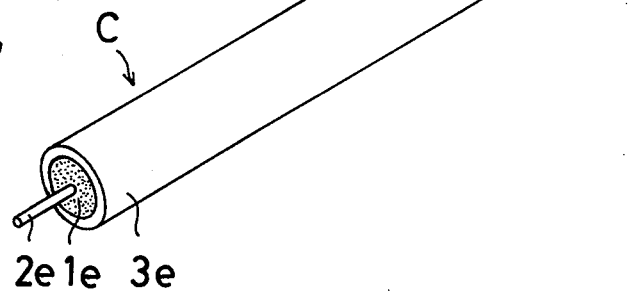
FIG.9
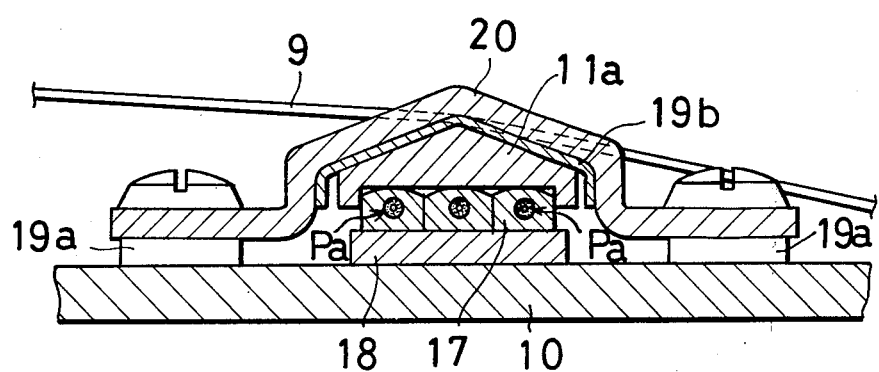

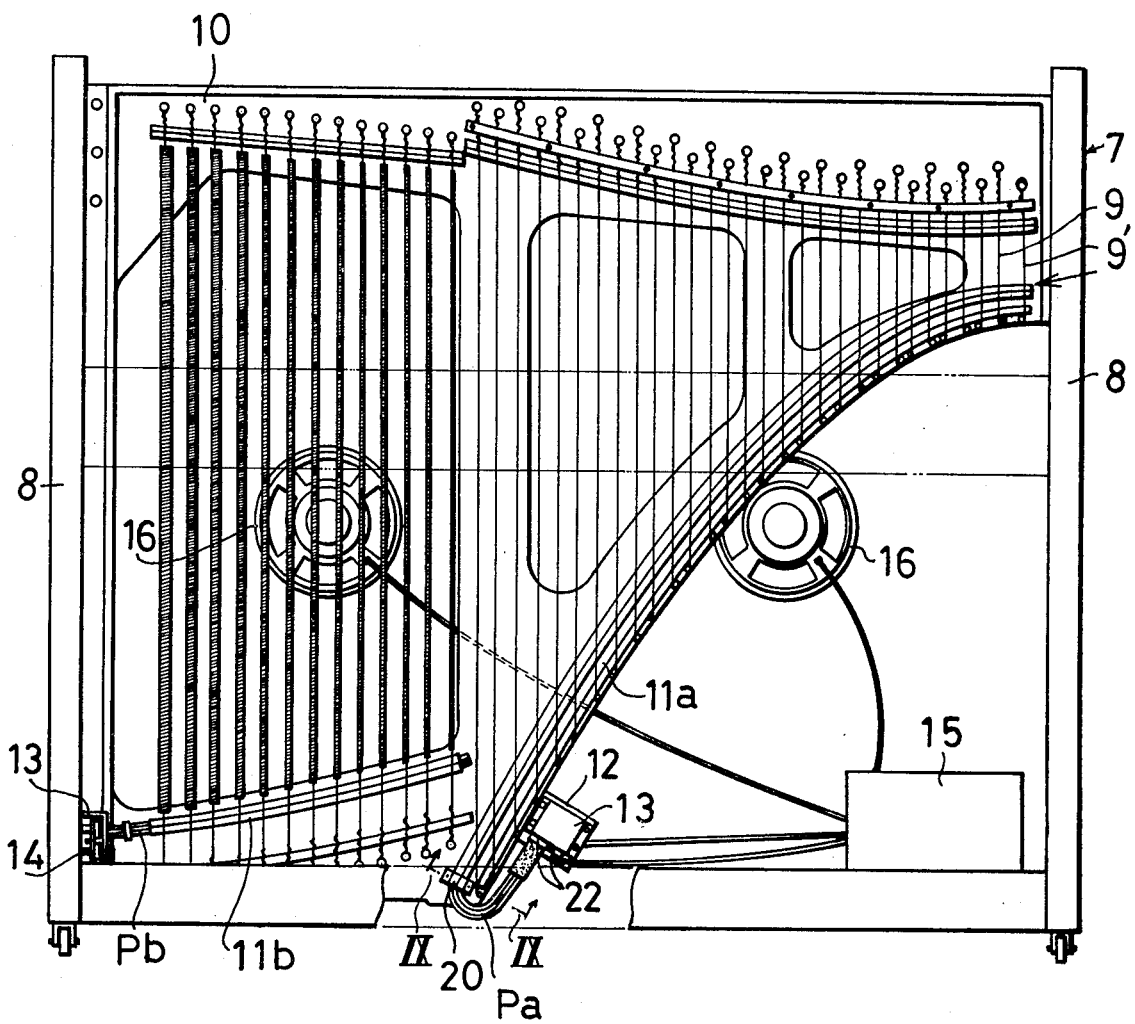
FIG.8
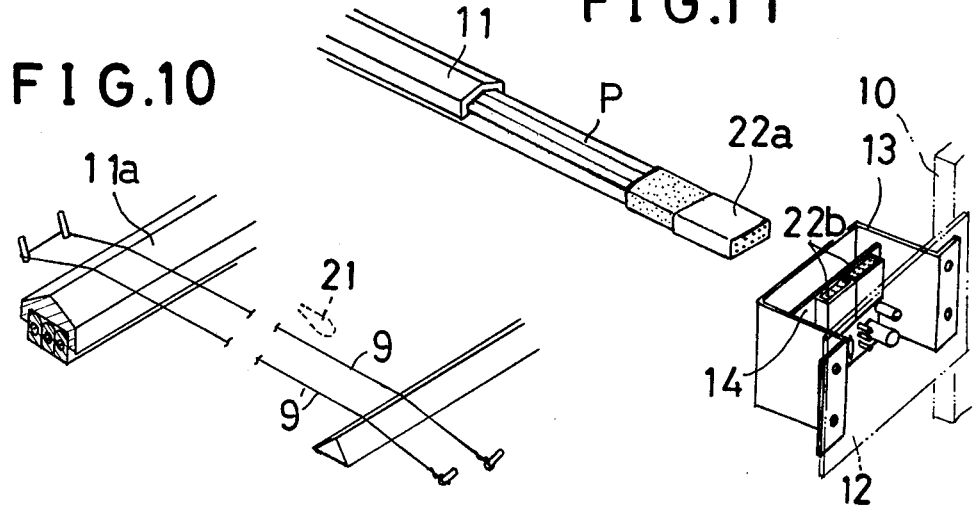
FIG.10
FIG.11

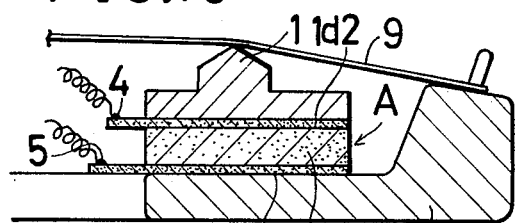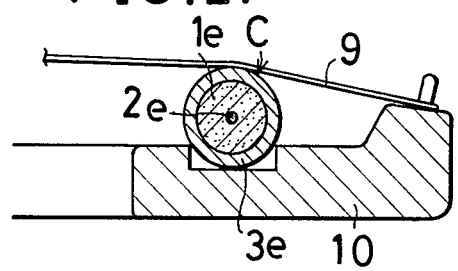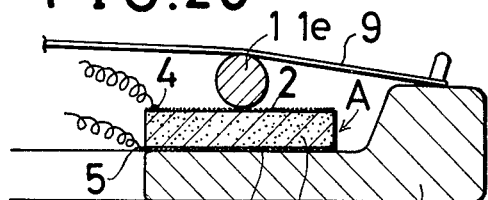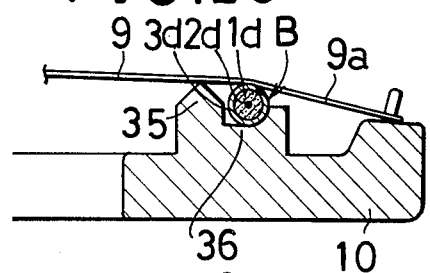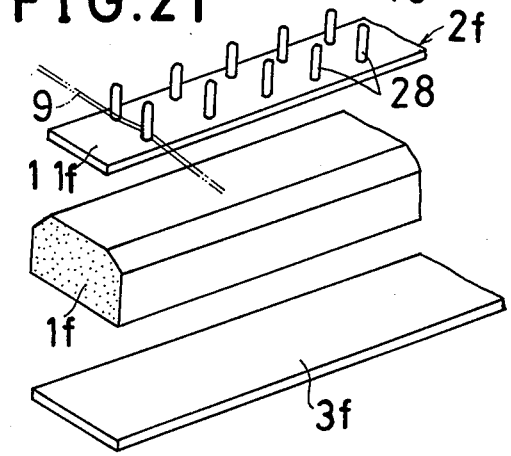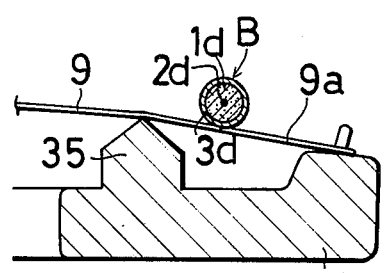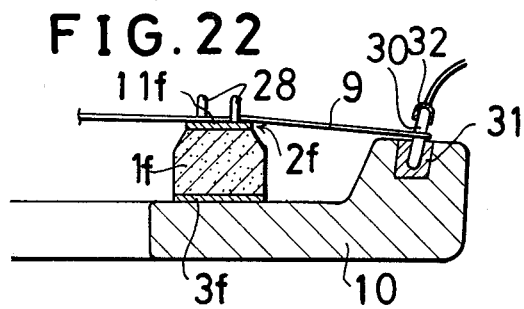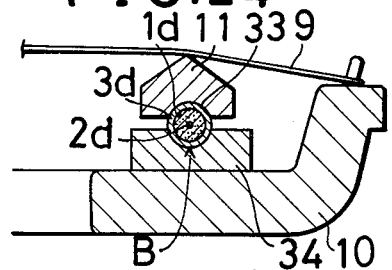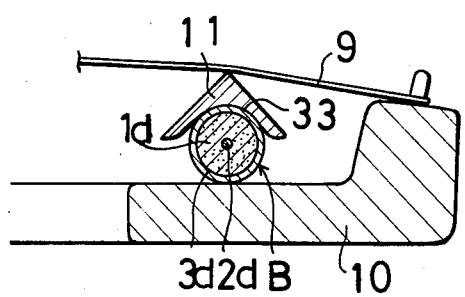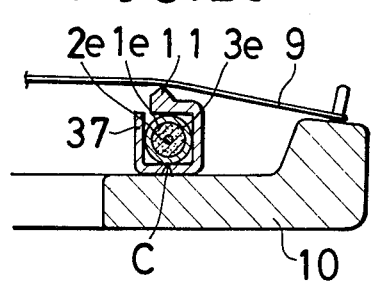

PICKUP APPARATUS FOR AN ELECTRIC STRING TYPE INSTRUMENT

This is a continuation of application Ser. No. 56,436, filed July 10, 1979, now abandoned.

FIELD OF THE INVENTION

This invention relates to pickup apparatus for an electric string type instrument, such as an electric piano or the like.

PRIOR ART

A conventional pickup of this kind usually comprises a bridge and a ceramic piezo-electric element placed on the lower surface thereof contained in a mold casing.

Such conventional pickup exhibits excellent characteristics in detecting string vibration, but, because an electric piano, for instance, does not have a sound-board as in a conventional piano, it takes a comparatively long time to damp the string vibration. Thus the damping is entirely different from that in the conventional piano. In order for the damping action of the electric piano to approach that of the conventional piano, it is known to provide an arrangement in which the pickup is interposed, through a damper made of an elastic material, such as rubber or the like, between the strings and the frame, so that a suitable damping is obtained.

However, this conventional arrangement has the disadvantage that not only does it require much time and effort to make such a pickup itself but also it requires much time and effort to install the pickup on the frame.

SUMMARY OF THE INVENTION

An object of the invention is to provide a pickup free from the above disadvantages.

Additionally, while it is known in conventional pickup apparatus to employ a plurality of pickups in a number corresponding to the number of strings provided on a frame, this has the disadvantage that since the pickups are mounted on the frame, the output connection wires must be soldered to respective output terminals of the pickups which requires much time and effort.

A further object of the invention is to provide pickup apparatus free from the above disadvantage of multiple connections.

The above and further objects of the invention are obtained by the provision of a pickup which comprises an elongated piezo-electric member of resilient property with a pair of electrodes on the member. The piezo-electric member is formed by mixing a high molecular material with piezo-electric ceramic powder and a vulcanizing or cross-linking agent. The mixture is vulcanized or crossed linked and is subjected to a polarization treatment after the electrodes have been mounted thereon.

The piezo-electric member may be a flat elongated member of belt-shape or it can be formed as a cylinder. In the latter case, one of the electrodes comprises a lead wire embedded axially in the piezo-electric member and the other electrode is mounted on the outer periphery of the piezo-electric member.

BRIEF DESCRIPTION OF THE FIGURES OF THE DRAWING

FIG. 5 is a perspective view of a further embodiment of a pickup.

FIG. 6 is a perspective view of a further embodiment of a pickup.

FIG. 7 is a perspective view of a further embodiment of a pickup.

FIG. 8 is a front view of an electric piano with the pickup apparatus of the instrument, the keyboard, action mechanism, top plate, and upper and lower front panels being removed to show interior details.

FIG. 9 is a sectional view taken along line IX—IX in FIG. 8.

FIG. 10 is a perspective view of a portion of the pickup apparatus in FIG. 8.

FIG. 11 is an exploded perspective view of a detail from FIG. 8 showing the connection between a pickup and a printed wiring board.

FIGS. 19 and 20 are sectional views of further embodiments of pickup apparatus.

FIG. 21 is an exploded perspective view of pickup apparatus according to the invention.

FIGS. 22 to 28 are sectional views of further embodiments of pickup apparatus.

DETAILED DESCRIPTION

Figure 1:
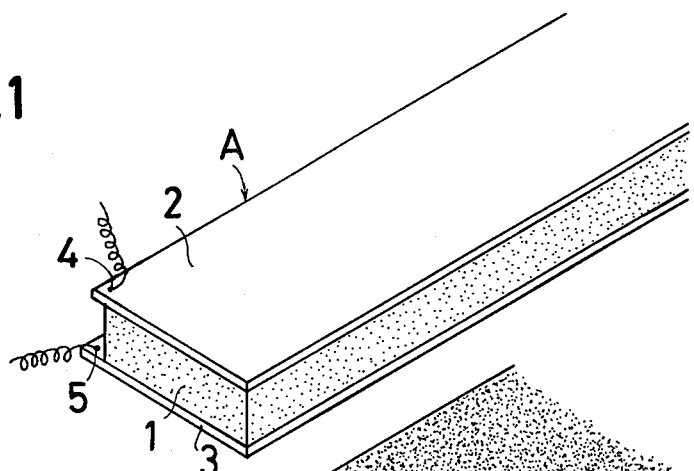
FIG. 1 is a perspective view of a pickup according to the invention.

FIG. 1 shows one embodiment of a pickup according to the invention wherein numeral 1 denotes an elongated or belt-shaped elastic piezo-electric member, numerals 2 and 3 denote electrodes on the upper and lower surface thereof, and numerals 4 and 5 denote output terminals thereof.

The elastic piezo-electric member 1 is manufactured by a process in which a high molecular material, such as natural rubber, synthetic rubber, synthetic resin or the like is mixed with piezo-electric ceramic powder and a vulcanizing or cross-linking agent, and the mixture is formed into a plate-shaped member. Adherently affixed on both surfaces of the plate-shaped member are electrodes 2 and 3 in the form of plates of electro-conductive rubber and the member is then subjected to a polarization treatment (with a voltage of 3,000-70,000 V), and the resultant product is cut into a number of belt-shaped elements constituting the resultant products i.e., the belt-shaped pickup A as shown in FIG. 1.

The piezo-electric ceramic powder is prepared by a process in which raw materials, such as lead zirconate, lead titanate and the like are mixed and sintered, and the resultant material is reduced to powder state.

Figure 2:
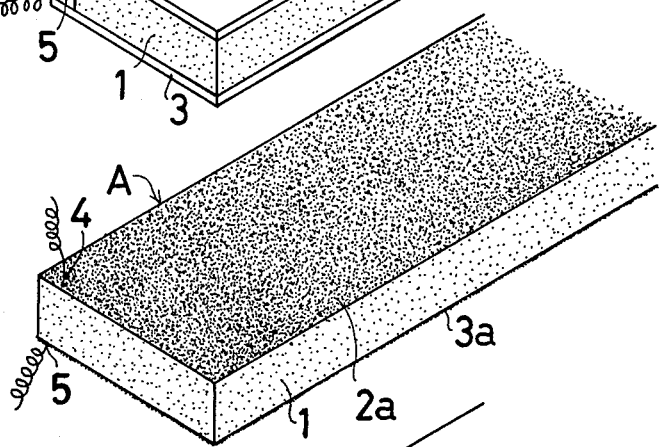
FIG. 2 is a perspective view of another embodiment of a pickup.

FIG. 2 shows an embodiment in which electrodes 2a, 3a are formed on the piezo-electric member 1 by a silver vapor deposition treatment.

Figure 3:
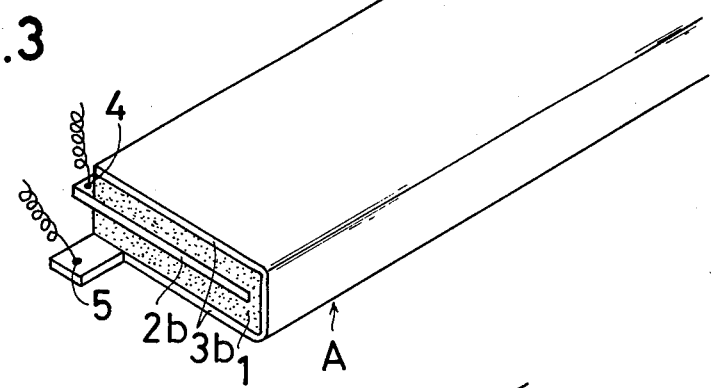
FIG. 3 is a perspective view of a further embodiment of a pickup.

FIG. 3 is another embodiment in which electrode plate 2b is embedded in the elastic piezo-electric member 1, and electrode plate 3b surrounds the surface of the elastic piezo-electric member 1 on three sides and is opposite the electrode plate 2b. The output terminals 4, 5 are connected to projections on the two electrode plates 2b, 3b.

Figure 4:
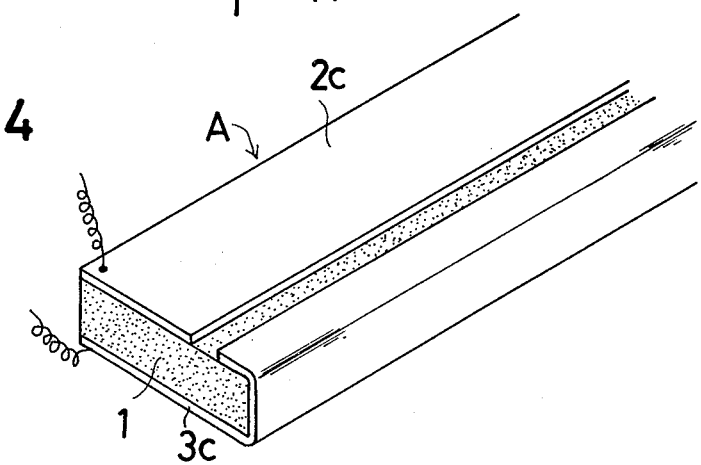
FIG. 4 is a perspective view of a further embodiment of a pickup.

FIG. 4 shows another embodiment in which upper electrode plate 2c is reduced in width, and lower electrode plate 3c is wider and is bent to cover a part of the upper surface of the member 1 while forming a gap with the upper electrode plate.

FIG. 5 shows a modification of the embodiment in FIG. 1 in which an insulation coating 6 is fixedly applied to plates 2 and 3 to cover the plates. The insulation coating 6 can be in the form of a layer or film of rubber. The coating 6 can also be employed in conjunction with the embodiments of FIGS. 2-4.

FIG. 6 shows an embodiment in which elastic piezoelectric member 1d is a cylindrical body and electrode 2d is in the form of a lead wire embedded axially therein. The outer periphery of the member 1d is covered by electrode 3d. The electrode 3d can be formed by silver vapor desposition or it can be constructed of electrically conductive rubber, metallic mesh or the like whereby there is obtained a pickup B.

FIG. 7 shows an embodiment in which electrode 3e is constituted as a metallic tube to obtain a pickup C. The electrode 2e is formed as a lead wire embedded in member 1e as in the embodiment in FIG. 6.

The pickups A, B, C may each be covered on its outer periphery with an insulating elastic member made of rubber, synthetic resin or the like.

Any of the aforesaid pickups are installed in an electric string type instrument as will be described below.

FIGS. 8-11 show the pickup apparatus applied to an electric piano.

FIG. 8 is a front view of the electric piano, from which the keyboard, action mechanism, top plate, lower front panel and upper front panel have been removed to show the manner of installation of the pickup apparatus.

Numeral 7 denotes a housing of the electric piano including opposite main panels 8. In substantially the same manner as in a conventional piano, a cast frame 10 on which a plurality of strings 9 are strectched is mounted between projection edges on the opposite main panels 8 of the housing 7. The piano includes a bridge 11 composed of a first bridge portion 11a for middle and high frequencies and a second bridge portion 11b for low frequencies. A pickup P is associated with the bridge 11 and the pickup comprises three elongated pickups Pa disposed under the bridge portion 11a and three elongated pickups Pb disposed under the bridge portion 11b. The pickups Pa and Pb are respectively connected to printed circuits mounted on wiring boards 14. Each board 14 is supported by a cover plate 13. The cover plate 13 associated with pickup Pa is connected to a supporting plate 12 connected to frame 10 while the cover plate 13 associated with pickup Pb is connected to another supporting plate 12 connected to panel 8. An amplifier 15 is connected to the output terminals of the boards 14 and speakers 16 are connected to the output terminals of the amplifier.

If, with this arrangement, any of the strings 9 is struck by a hammer (not illustrated) in response to actuation of a key of the keyboard of the piano, the vibration of the string 9 is transmitted to the associated pickup through the bridge, and an output signal corresponding to the vibration is generated at the electrodes of the pickup and is fed to the printed wiring board 14. The output signals of the three pickups P are mixed together in this circuit and are then amplified by the amplifier 15, whereby a tone similar to that obtained from the soundboard of a conventional piano is produced by the speaker 16.

Each of the pickups shown in FIG. 9 is constructed in the manner as shown in FIG. 6 and is embedded in an elastic member 17 made of urethane foam, rubber, or the like, and the upper surface of the elastic member 17 has a curved upper surface. Three of the pickups are disposed parallel to one another and are adhered to a wooden board 18 placed on the frame 10. The bridge 11a for middle and high frequencies is adhesively secured to the three pickups Pa and the left lower end of the bridge 11a is restrained by a metallic band 20 (see FIGS. 8 and 9). The band 20 is connected at both its ends to the frame 10 through respective washers 19a made of felt or the like as seen in FIG. 9. An elastic member 19b made of felt or the like is affixed to the inner surface of the band 20 and bears on the bridge 11a. The right upper end portion of the bridge 11a is resiliently retained by the tension force of a subsidiary string 9' which is connected to the string 9 but is not struck by a hammer 21, as shown in FIG. 10.

The three pickups Pb for low frequencies and the three pickups Pa for high and middle frequencies are respectively extended, as shown in FIGS. 8 and 11 beyond the respective bridge 11 and beyond the frame 10, and a male connector 22a is attached to an end portion of each pickup. The connector 22a is connected to a female connector 22b provided on the printed wiring board 14 to interconnect the pickups P and the board 14. Thus, it becomes unnecessary to use a connecting wire and the influence of noise coming from the exterior is reduced.

The three pickups P are disposed in parallel to one another and the respective output signals thereof come together to a circuit in the printed wiring board 14, so that even if there occurs any trouble in one of the pickups, the production of a musical tone is continued.

Figure 12:
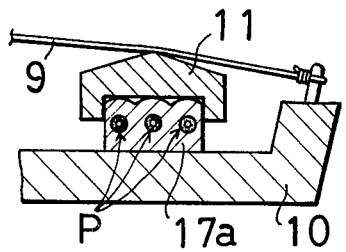
FIG. 12 is a sectional view of another embodiment of pickup apparatus according to the invention.

FIG. 12 shows another embodiment in the case where the three pickups P are disposed parallel to one another. Namely, the three pickups P are embedded in a single common elastic member 17a so as to be integrally supported thereby.

The upper surface of the elastic member 17a is formed with an arcuate surface over each pickup P, so that each of the pickups P can receive concentrated string vibration energies through the bridge 11 and consequently can generate a large output signal.

Figure 13:
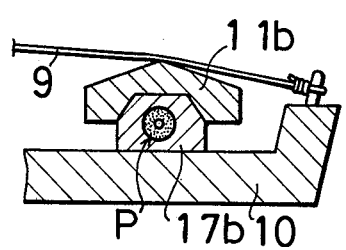
FIGS. 13 and 14 are sectional views of further embodiments of pickup apparatus.
Figure 14:
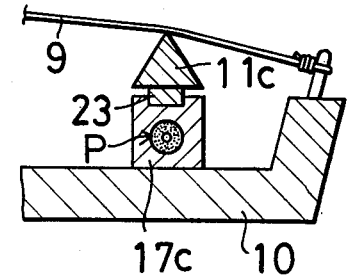

FIGS. 13 and 14 show other embodiments. Namely, FIG. 13 shows an embodiment in which the upper portion of elastic member 17b of the pickup P is chamfered at its corners so that its upper surface is trapezoidal in section, and the bridge 11b mounted thereon is provided with a groove at its lower surface which is of corresponding shape to tightly receive the upper portion of the elastic member 17b. FIG. 14 shows an embodiment in which a hard, high transmission member 23 of small size is embedded in the upper surface of elastic member 17c and triangular ridge 11c is secured or integral with member 23.

By the constructions as shown in FIGS. 13 and 14 an output is produced which is about 5-6 dB higher than that in which the upper surface of the elastic member is flat.

The bridge 11 tends to be moved inwardly of the frame 10 by the resultant tensile forces of the strings 9, and the left lower end portion of the bridge 11a for high and middle frequencies is especially liable to be so moved because the bridge is obliquely crossed by the strings 9. Accordingly, as previously disclosed, the left lower end portion of the bridge 11a is resiliently engaged by the band 20 to prevent the bridge from moving inwardly and at the same time to prevent the bridge from floating upwards. This eliminates the problem that the pitch of the strings is changed, the output level of the musical tone is lowered and the tone quality is adversely affected.

The presence of the elastic member 19b (FIG. 8) affixed to the band 20 and washers 19a of elastic material interposed between the band and the frame 10 allow the bridge 11 to be vibrated by the vibrations of the strings 9. The band 20 may be replaced by a hard elastic material, such as hard rubber of about 95 to 99 degrees in rubber hardness or the like or a metallic base member coated with elastic material.

The end portion of bridge 11a which is at the higher frequency end is resiliently pressed by the subsidiary string 9' and thereby the bridge can be prevented from floating upwards as mentioned before, so that lowering of the output levels of the musical tones can be prevented.

Figure 15:
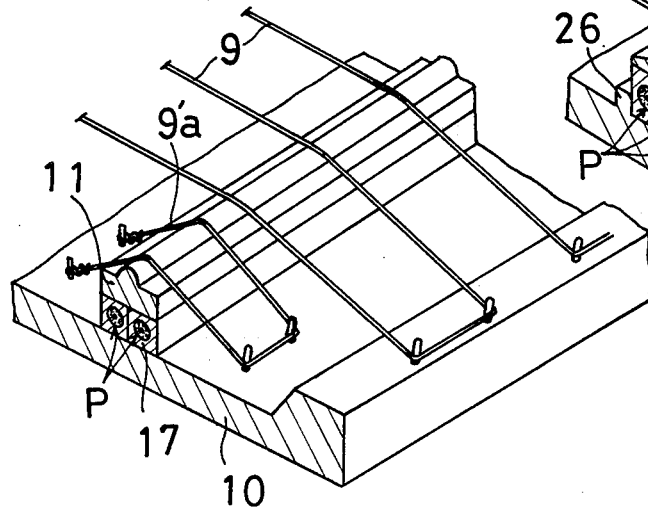

FIG. 15 shows another embodiment of such resilient pressing means and in this case the resilient pressing member is composed of a subsidiary string 9a which is separate from the strings 9 and is not used for producing a tone.

Figure 16:
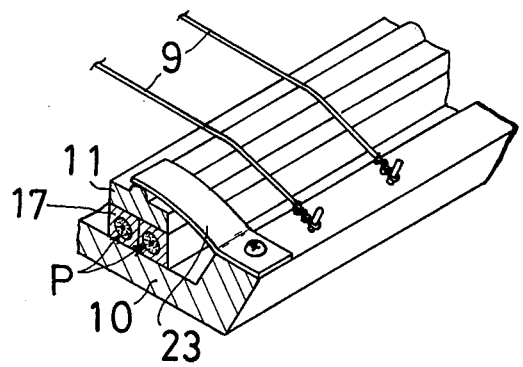
FIGS. 15 to 17 are perspective views of modified embodiments of resilient pressing means of the pickup apparatus.
Figure 17:
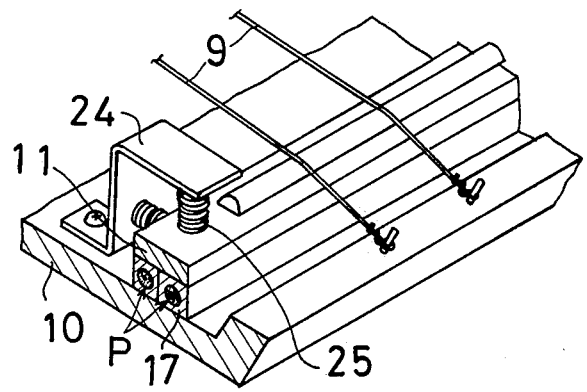

FIGS. 16 and 17 show further embodiments of the resilient pressing means and in FIG. 16 there is seen a cantilever spring 23 which is fixed at its base end portion to the frame 10 and bears with its free end on bridge 11 while in FIG. 17 the resilient pressing member comprises a base member 24 which is fixed at one end to the frame 10 and extends at its other end over the end portion of the bridge 11 and a spring 25 is interposed between the base member 24 and the bridge 11.

Figure 18:
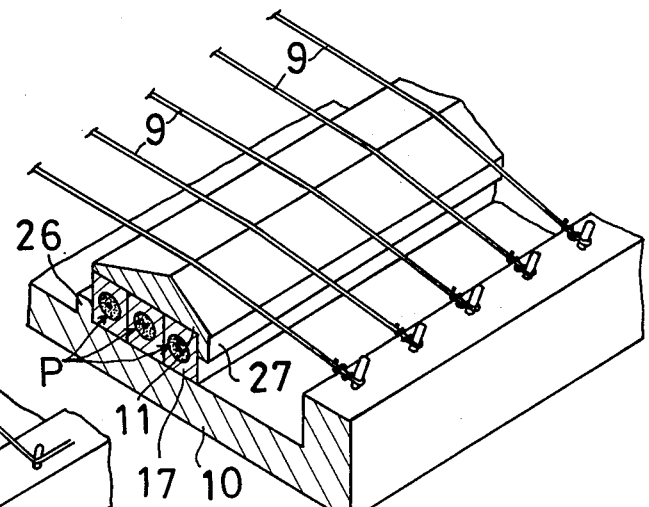
FIG. 18 is a perspective view of another embodiment of pickup apparatus.

FIG. 18 shows an embodiment for preventing the bridge 11 and the pickups P from moving. Namely, a ridge 26 on frame 10 extends along an inward side of the elastic member 17 of the pickups P and is engaged with said inward side, and a projection edge 27 is formed on the outward edge of the bridge 11 and is engaged with the outward side of the elastic member 17. The bridge 11 may be divided into a plurality of elements, each of which corresponds to one of the strings 9.

The wood board 18 which is interposed between the pickups P and the frame 10 as shown in FIG. 9 is a lauan plywood of five layers. However, the board 18 may be a plywood construction of three layers or even a conventional monolithic wood block. The wood board 18 serves to minimize unevenness of tone qualities and tone color caused by uneven surfaces of the frame 10 formed as a result of flow of molten metal or the like at the time when the frame 10 is cast. In such case, the bottom surface of the wood board 18 is deformed according to the uneven surface of the frame 10 to adapt itself to the uneven surface while the flat upper surface of the wood board 18 remains flat and is suitable for the mounting of the pickups P whereby individual vibration pressures of the strings 9 can be transmitted substantially uniformly to the pickups P so that predetermined musical tones of substantially constant tone volumes and tone colors are obtained.

FIG. 19 shows an embodiment of a pickup apparatus in which bridge 11d of a length extending over a plurality of strings 9 is placed on the belt-shaped pickup A in FIG. 1 and the resultant assembly is interposed between the strings 9 and the frame 10. FIG. 20 shows an embodiment in which bridge 11e of cylindrical shape is placed on the pickup A in FIG. 2. The pickups of FIGS. 3 and 4 may also be employed in an electric string type instrument in such a manner as shown in FIG. 19 or 20.

FIGS. 21 and 22 show an embodiment in which elastic piezo-electric member 1f of column form is provided with an electrode 2f comprised of a conductive bridge 11f laminated to the top surface of the member 1f and provided with a number of upright pins 28 thereon serving as string guides. At its bottom surface the member 1f has a laminated electrode plate 3f. The resulting assembly is interposed between the strings 9 and the frame 10, and a pitch pin 30 and a tuning pin (not illustrated) are insulated by a respective insulation bushing 31 whereby an output signal can be taken out through a cap 32 mounted on the pitch pin 30.

FIGS. 23 and 24 each shows an embodiment in which cylindrical pickup B as shown in FIG. 6 is provided. Bridge 11 is mounted on the pickup and the pickup and bridge are interposed between the strings 9 and the frame 10. In each case, the lower surface of the bridge 11 is provided with a groove 33 in which the pickup B is mounted. In FIG. 23 the pickup B is placed directly on the frame 10, and in FIG. 24 the pickup B is placed on the frame through a supporting member 34.

In each of FIGS. 25 and 26 the strings 9 are supported by a bridge 35, and the cylindrical pickup B is in pressure contact with an end portion of each string 9.

In FIG. 25 the frame 10 is provided below end portions 9a of strings 9 with a supporting mount 36, and the pickup B is interposed between the supporting mount 36 and the end portions 9a whereby the pickup B is in pressure contact with the end portions 9a. In FIG. 26 pickup B is in pressure contact with the end portions 9a from above. Although pickup B has been shown in contact with the end portions 9a of the strings at the lower end of the strings, the pickup B may be in pressure contact with the end portions of the strings 9 at the upper end.

FIGS. 27 and 28 each shows an embodiment in which the pickup C shown in FIG. 7 is installed on the frame 10. In FIG. 27 the pickup C is interposed directly between the strings 9 and the frame 10. Pickup C does not especially require a bridge because the outer periphery of the pickup is formed of a metallic tube 3e. However, the pickup C may be provided with bridge 11 serving also as a holding frame 37 as shown in FIG. 28.

Thus, according to this invention, a mixture of a high molecular material with piezo-electric ceramic powder and a vulcanizing or cross-linking agent is vulcanized or cross-linked and is formed into an elastic piezo-electric member, and this member is subjected to a polarization treatment to form a pickup, so that there is not required a conventional, separate damper member for damping string vibrations in addition to the pickup and the pickup of the invention itself serves as the damper member. Thereby installation and the parts necessary for the installation in an electric string type instrument can be simplified. Additionally, according to this invention, the pickup is formed as an elongate member extending over a plurality of strings so that two output terminals thereof are sufficient and thus wiring materials can be saved and the labor for connecting the output terminals of the pickup can be substantially reduced.

A long electric piezo-electric member is so prepared, for example, that a high molecular material of about 100 parts in weight and piezo-electric ceramic powder of about 100~1000 parts in weight are mixed and kneaded together with vulcanizing or cross-linking agent of about 1~10 parts in weight with or without organic solvent of a small amount, and the resultant mixture is molded under pressure by heating into a predetermined long and thick plate.

What is claimed is:

1. Pickup means for electric string-type instrument, which instrument comprises a frame and a plurality of strings mounted on a frame, each string producing a note; said pickup means comprising:
   a plurality of individual elastic elongated pickups, each pickup comprising:
   an elastic, cylindrical piezo-electric member, said piezo-electric member being prepared by mixing a high molecular material with a piezo-electric ceramic powder and a vulcanizing agent, said piezo-electric member being polarized;
   a pair of electrodes on said piezo-electric member, one of said electrodes comprising a lead wire embedded axially in said piezo-electric member, the other electrode being mounted on the circumferential periphery of said piezo-electric member; and
   an insulating member encasing said piezo-electric member and said pair of electrodes, said elastic member having an upper non-planar surface; and
   a bridge member directly mounted on the upper non-planar surfaces of the plurality of pickups, the pickups being disposed longitudinally parallel to one another;
   the pickup means being directly interposed between said strings and said frame, with said pickups resting on said frame so that the plurality of pickups and the bridge member extend to support plural strings covering plural notes of the instrument so as to be common thereto.

2. A pickup means as claimed in claim 1 wherein said other electrode comprises a metallic tube surrounding the outer periphery of said piezo-electric member.

3. A pickup means as claimed in claim 1 further comprising resilient pressing means for pressing an end portion of the bridge member against the frame.

4. A pickup means as claimed in claim 3, wherein said resilient pressing means comprises a subsidiary string which does not produce a musical tone and is stretched on the frame and bears on said bridge member.

5. A pickup means as claimed in claim 3, wherein said resilient pressing means comprises a cantilever element having one end fixed to the frame and a free end applying pressure to said bridge member, holding said bridge member and said plurality of individual pickups against the frame.

6. A pickup means as claimed in claim 3, wherein said resilient pressing means comprises a base member having one end fixed to the frame and a free end overlying the bridge member, and a spring interposed between said free end of the base member and the bridge member.

7. A pickup means as claimed in claim 1 further comprising a band engageably extending over an end portion of said bridge member and having opposite ends fixed to the frame.

8. A pickup means as claimed in claim 1 wherein said elastic members have an inward side and an outward side, said frame including a ridge extending along one side of the elastic members to support the inward side, said bridge member including a projection extending along an outward side of the bridge member for supporting the outward side of the elastic members, whereby said pickups are sandwiched between said ridge and projection.

9. A pickup means as claimed in claim 1 further comprising a printed wiring board mounted at a predetermined position and connected to said plurality of pickups.

10. A pickup means as claimed in claim 1 further comprising a wood board interposed between said plurality of pickups and the frame.

* * * * *